(12) United States Patent
Muraoka et al.

(10) Patent No.: US 10,790,086 B2
(45) Date of Patent: Sep. 29, 2020

(54) METHOD OF MANUFACTURING METAL NANO COIL

(71) Applicants: MITSUBISHI HEAVY INDUSTRIES, LTD., Tokyo (JP); AKITA UNIVERSITY, Akita (JP); TSUCHIYA Co., Ltd., Aichi (JP)

(72) Inventors: Mikio Muraoka, Akita (JP); Nobuyuki Kamihara, Tokyo (JP); Naomoto Ishikawa, Tokyo (JP); Toshiyuki Takayanagi, Tokyo (JP); Hideki Horizono, Tokyo (JP); Hiroaki Hayashi, Aichi (JP); Osamu Yoshida, Aichi (JP); Kotaro Tsuji, Aichi (JP)

(73) Assignees: MITSUBISHI HEAVY INDUSTRIES, LTD., Tokyo (JP); AKITA UNIVERSITY, Akita (JP); TSUCHIYA CO., LTD., Aichi (JP)

( * ) Notice: Subject to any disclaimer, the term of this patent is extended or adjusted under 35 U.S.C. 154(b) by 448 days.

(21) Appl. No.: 15/548,761

(22) PCT Filed: Feb. 9, 2016

(86) PCT No.: PCT/JP2016/053789
§ 371 (c)(1),
(2) Date: Aug. 3, 2017

(87) PCT Pub. No.: WO2016/129589
PCT Pub. Date: Aug. 18, 2016

(65) Prior Publication Data
US 2018/0025842 A1 Jan. 25, 2018

(30) Foreign Application Priority Data
Feb. 9, 2015 (JP) ................................ 2015-023099

(51) Int. Cl.
*H01F 41/04* (2006.01)
*C23C 14/58* (2006.01)
(Continued)

(52) U.S. Cl.
CPC .......... *H01F 41/042* (2013.01); *B22F 1/0025* (2013.01); *B82Y 40/00* (2013.01);
(Continued)

(58) Field of Classification Search
CPC .......... D01D 5/00; D01D 4/02; D01D 5/0007; D01D 5/0015; D01D 5/06; D01D 5/24;
(Continued)

(56) References Cited

U.S. PATENT DOCUMENTS

| 4,175,153 A | 11/1979 | Dobo et al. |
| 5,352,512 A | 10/1994 | Hoffman |

(Continued)

FOREIGN PATENT DOCUMENTS

| JP | 54-151622 A | 11/1979 | |
| JP | H0924919 | * 9/1997 | ............. B29C 70/10 |

(Continued)

OTHER PUBLICATIONS

Seung-Hoon Choi, Hollow ZnO Nanofibers Fabricated Using Electrospun Polymer Templates and Their Electronic Transport Properties, ACS Nano (2009)—vol. 3—No. 9—p. 2623-2631 (Year: 2009).*

(Continued)

*Primary Examiner* — Alexandra M Moore
*Assistant Examiner* — Austin Pollock
(74) *Attorney, Agent, or Firm* — Kanesaka Berner and Partners LLP (57) ABSTRACT

Provided is a method of manufacturing a metal nano coil which is suitable for mass production and results in a lower manufacturing cost. The method of manufacturing a metal (Continued)

nano coil includes the steps of: forming, with tension applied to a core member composed of nanofiber of a polymer, a metal thin film on a surface of the core member to fabricate a metal-covered nanofiber; reducing the tension of the metal-covered nanofiber; and heating, with the tension reduced, the metal-covered nanofiber to at or above a boiling point or a thermal decomposition temperature of the polymer and at or below the melting point of the metal thin film to vaporize the core member and shrink the metal thin film into a coil form, so that a hollow metal nano coil is produced.

3 Claims, 8 Drawing Sheets

(51) Int. Cl.
| | |
|---|---|
| B22F 1/00 | (2006.01) |
| D01F 6/14 | (2006.01) |
| D01D 5/00 | (2006.01) |
| B82Y 40/00 | (2011.01) |
| C23C 14/20 | (2006.01) |
| C23C 14/34 | (2006.01) |
| D01D 1/02 | (2006.01) |
| H01F 27/28 | (2006.01) |
| B22F 1/02 | (2006.01) |
| B82Y 25/00 | (2011.01) |
| B82B 3/00 | (2006.01) |

(52) U.S. Cl.
CPC ............ *C23C 14/205* (2013.01); *C23C 14/34* (2013.01); *C23C 14/5806* (2013.01); *D01D 1/02* (2013.01); *D01D 5/003* (2013.01); *D01D 5/0076* (2013.01); *D01F 6/14* (2013.01); *H01F 27/28* (2013.01); *B22F 1/025* (2013.01); *B22F 2001/0029* (2013.01); *B82B 3/0095* (2013.01); *B82Y 25/00* (2013.01); *D01D 5/0038* (2013.01); *D10B 2321/08* (2013.01)

(58) Field of Classification Search
CPC ... B29C 48/0022; B29C 53/585; B29C 53/64; B29C 53/822; B29C 67/202; H01F 41/042; H01M 4/86; H01M 4/866

USPC ......................................................... 148/537
See application file for complete search history.

(56) References Cited

U.S. PATENT DOCUMENTS

| | | | |
|---|---|---|---|
| 2007/0243124 | A1 | 10/2007 | Baughman et al. |
| 2009/0162468 | A1* | 6/2009 | Barinov ............... D01D 5/0092 425/145 |
| 2010/0008994 | A1* | 1/2010 | Reneker ............... D01D 5/0092 424/489 |
| 2011/0033974 | A1 | 2/2011 | Wang et al. |
| 2014/0332733 | A1 | 11/2014 | Joo et al. |
| 2016/0072036 | A1* | 3/2016 | Kim .................... D01D 5/0076 136/205 |
| 2018/0291527 | A1* | 10/2018 | Beachley ............. D01D 5/0076 |

FOREIGN PATENT DOCUMENTS

| | | |
|---|---|---|
| JP | 2004-91985 A | 3/2004 |
| JP | 2008-69494 A | 3/2008 |
| JP | 2011-36995 A | 2/2011 |
| JP | 2011214074 A * | 10/2011 |
| JP | 2013-188808 A | 9/2013 |
| JP | 2014-531519 A | 11/2014 |

OTHER PUBLICATIONS

Mikio Muraoka, Residual-Strain-Induced Nanocoils of Metallic Nanowires,J. Nanoscience and Nanotechnology (2008) 8:439-442 (Year: 2008).*
Chang. G, et. Al.; "Morphology control of nanohelix by electrospinning"; (2012) Applied Physics Letter; 101, 23505 (Year: 2012).*
International Search Report in PCT/JP2016/053789, dated Apr. 26, 2016, 5pp.
Written Opinion of the ISA in PCT/JP2016/053789, dated Apr. 26, 2016, 7pp.

* cited by examiner

METHOD OF MANUFACTURING METAL NANO COIL

RELATED APPLICATIONS

The present application is a National Phase of International Application Number PCT/JP2016/053789, filed Feb. 9, 2016, which claims priority to Japanese Application Number 2015-023099, filed Feb. 9, 2015.

TECHNICAL FIELD

The present invention relates to a method of manufacturing a metal nano coil.

BACKGROUND ART

Nanowires, nanotubes, nano coils, and other nanostructures having a two-dimensional size on the order of nanometers (in the range of about one to several-hundred nanometers) are expected to be used in various ways. For instance, metal nanowires and nano coils are promising materials for conductive fillers used for conductive carbon fiber reinforced plastics (CFRPs), primers, and the like.

In a method of bonding a thermoplastic resin by using microwave induction heating, a high-performance microwave heating element needs to be mixed into an adhesive. A typical microwave heating element is magnetic powder which has a low calorific value per unit weight and thus cannot be used for bonding of a thermoplastic resin. For this reason, a metal nano coil is being discussed for use as a high-performance microwave heating element.

PTL 1 discloses a method of manufacturing a hollow nanotube, including growing a nanowire on a substrate, forming an outer covering layer on the nanowire surface, and then removing the entire nanowire.

PTL 2 discloses a method of manufacturing a hollow nanostructure, including sequentially forming a carbon-coated layer and a shell layer on a surface of an oxide core member to fabricate a core shell structure, and thermally annealing the core shell structure for reductive thermal decomposition of the oxide core member.

CITATION LIST

Patent Literature

{PTL 1}
Japanese Unexamined Patent Application, Publication No. 2011-36995
{PTL 2}
Japanese Unexamined Patent Application, Publication No. 2013-188808

SUMMARY OF INVENTION

Technical Problem

The manufacturing method in PTL 1 requires chemical-vapor deposition of a nanowire (crystals) and is therefore not suitable for mass production and results in a high cost.

The manufacturing method in PTL 2 requires formation of at least two layers on a surface of the core member and involves reaction between the oxide core member and the carbon-coated layer by thermal annealing, thereby leading to a long time and a high cost for manufacturing the nanostructure.

An object of the present invention is to provide a method of manufacturing a metal nano coil, which is suitable for mass production and results in a lower manufacturing cost.

Solution to Problem

The first aspect of the present invention is a method of manufacturing a metal nano coil, including the steps of: forming, with tension applied to a core member composed of nanofiber of a polymer, a metal thin film on a surface of the core member to fabricate a metal-covered nanofiber; reducing the tension of the metal-covered nanofiber; and heating, with the tension reduced, the metal-covered nanofiber to at or above a boiling point or a thermal decomposition temperature of the polymer and at or below the melting point of the metal thin film to vaporize the core member and shrink the metal thin film into a coil form, so that the metal nano coil is produced.

A metal nano coil fabricated by the aforementioned method features a low specific gravity and a small cross-sectional area.

The aforementioned method, which uses polymer nanofiber for the core member, involves a simple process compared to PTL 1, which uses chemical-vapor deposition for forming a core member, and therefore enables mass production of metal nano coil at once. The method of the present invention has an advantage in that it enables easy shrinkage into a coil form compared to conventional techniques. With the method of the present invention, a right-handed coil and a left-handed coil are made with almost the same number of turns. Hence, microwave induction heating enables uniform heating even when the polarization direction for microwaves changes.

It is preferable that the aforementioned aspect further include the steps of: placing two metal movable plates separately; and forming the core member between the movable plates by using an electrospinning method.

The electrospinning method, which enables simple mass production of nanofiber, has an advantage in lower production cost.

In the aforementioned aspect, it is preferable that the tension of the metal-covered nanofiber be reduced by reducing the distance between the movable plates, and the metal-covered nanofiber be heated with the metal-covered nanofiber fixed to the movable plates.

Since the substrate (the movable plates) on which nanofiber is formed by the electrospinning method is used to reduce the tension of the metal-covered nanofiber and perform heating, the process is simplified.

Advantageous Effects of Invention

According to the present invention, metal nano coils can be mass-produced at once in a simpler process than chemical-vapor deposition. Accordingly, the manufacturing cost can be dramatically reduced.

The present invention enables manufacture of a nano coil with a lower specific gravity than those of nano coils fabricated by the crystal growth method.

DESCRIPTION OF EMBODIMENTS

A method of manufacturing a metal nano coil according to one embodiment of the present invention will now be explained with reference to the drawings.
<Core Member Preparation>
Polymer nanofiber is prepared as a core member. Nanofiber refers to a fibrous nanosubstance that has a nanoscale size (one to several hundred nanometers) in two dimensions (dimensions intersecting at right angles with the longitudinal direction) and has a much larger size in the last one dimension (dimension in the longitudinal direction) than in the aforementioned two dimensions.

Examples of this polymer include polyvinyl alcohol (PVA), polyethylene terephthalate (PET), polyurethane (PU), polyacrylonitrile (PAN), polylactic acid (PLA), polyphenylene vinylene (PPV), and nylon 6. The polymer may be composed of one type of polymer or a mixture of multiple types of polymer.

Nanofiber is fabricated by the electrospinning method, the melt blowing method, the drawing method, or the like. A method of manufacturing nanofiber using the electrospinning method will be explained below in detail.
<Fabrication of Core Member with Electrospinning Method>
The electrospinning method allows easy fabrication of nanofiber.

Figure 1:
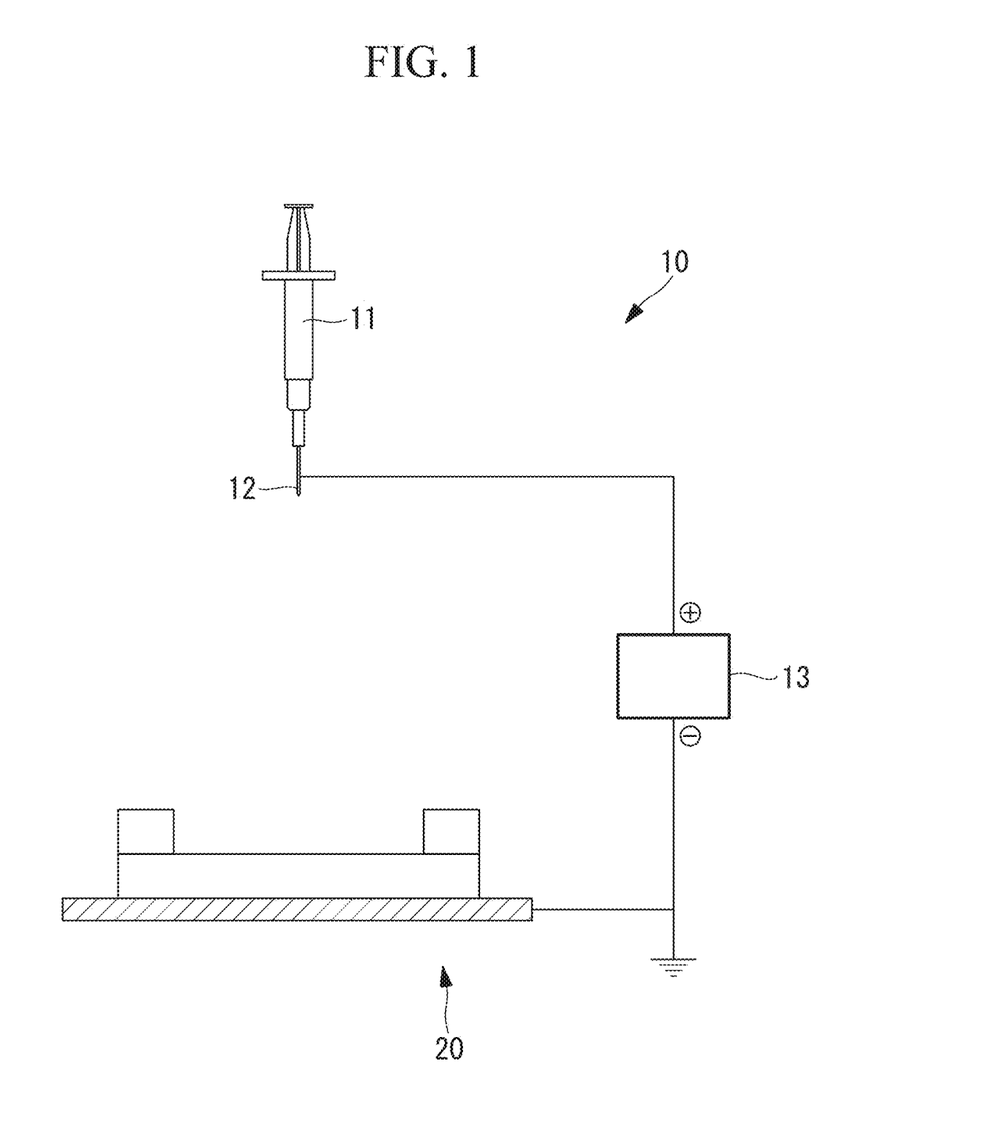
FIG. 1 is a schematic view of a core member manufacturing apparatus using the electrospinning method.

FIG. 1 is a schematic view of a core member manufacturing apparatus using the electrospinning method. A manufacturing apparatus 10 includes a syringe 11, a high-voltage power source 13, and a substrate 20.

The syringe 11 is fixed above the substrate 20 through a stand not shown in the drawing, in a position a predetermined distance away from the substrate 20. The syringe 11 has a metal nozzle 12 at the tip.

The syringe 11 is filled with a polymer solution containing the aforementioned polymer. The solvent of the polymer solution may be any solvent in which this polymer can dissolve. The solvent is, for example, water, trichloroacetic acid, dimethylformamide, chloroform, methanol, or formic acid. The polymer concentration in the polymer solution is appropriately set by considering the viscosity, the polymer solubility, the size of a core member to be fabricated, and the like.

Figure 2:
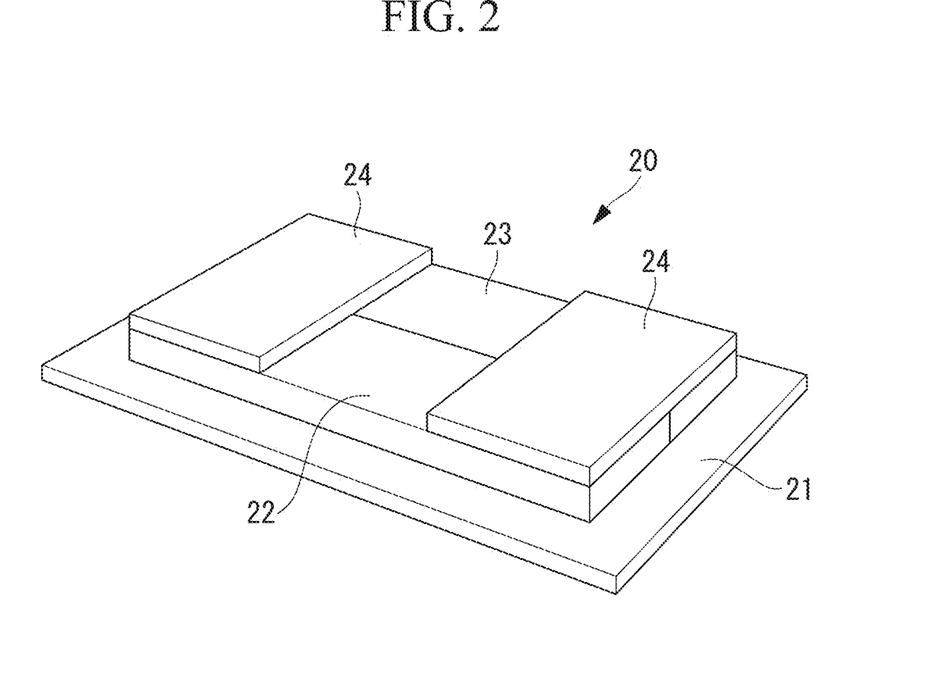
FIG. 2 is a perspective view of a substrate of the core member manufacturing apparatus.

FIG. 2 is a schematic view for explaining the substrate 20 in FIG. 1. The substrate 20 includes a support plate 21 and a polytetrafluoroethylene plate (PTFE plate) 22 and a metal movable plate support member 23 which are placed on the support plate 21. Two metal movable plates 24 are placed separately on the PTFE plate 22 and the movable plate support member 23.

Figure 3:
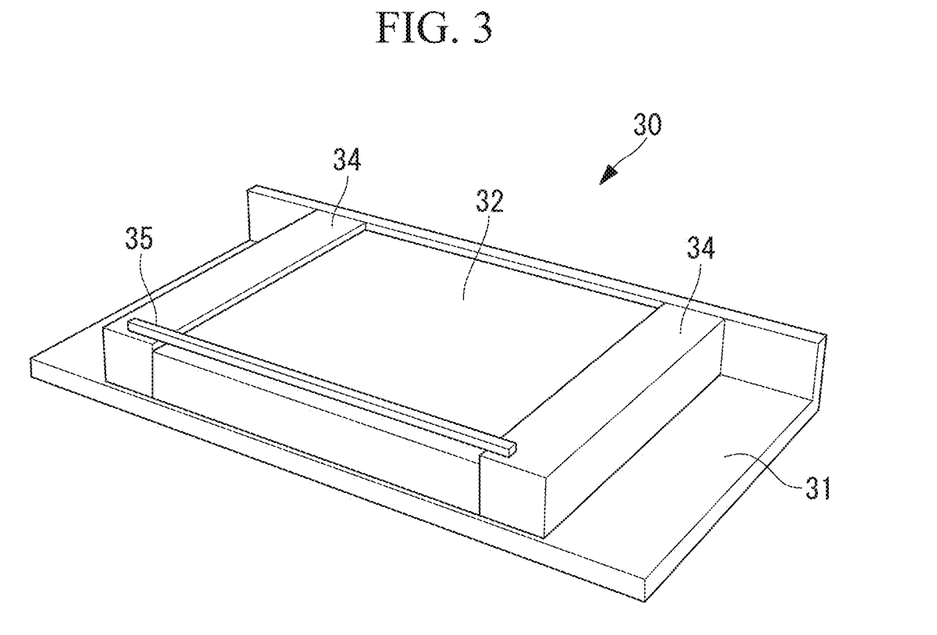
FIG. 3 is a perspective view of another example of a substrate of the core member manufacturing apparatus.

FIG. 3 is a schematic view of another example of a substrate applicable to the manufacturing apparatus 10 according to this embodiment. The substrate 30 shown in FIG. 3 is used particularly when the area between the movable plates (represented by the reference numeral 34) (the area of a region where nanofiber is fabricated) is large.

The substrate 30 includes on an L-shaped support plate 31, two metal movable plates 34, and a PTFE plate 32 placed between the movable plates 34. A flexible member 35 is fixed between the movable plates 34. The flexible member 35 has a melting point of at or above 300° C. and may be any member as long as it is flexible. The flexible member 35 is a copper wire, for example.

The distance between the movable plates (24,34) is set according to the size (length) of a core member to be fabricated. For the substrate 30 shown in FIG. 3, the distance between the movable plates 34 is determined according to the width of the PTFE plate 32.

The thickness of the movable plates (24,34) is set according to the distance between the movable plates (24,34) such that a contact with the support plates (21,31) is avoided when fiber tension is loosened for bending as described later. However, the thicker the movable plates 34 are (the longer the distance between the support plate 31 and the upper surfaces of the movable plates 34 is), the more unstable the substrate 30 is. As for the substrate 30 shown in FIG. 3, even if the movable plates are thicker than in the substrate 20 in FIG. 2, the stability of the movable plates is ensured. In other words, as for the substrate 30 in FIG. 3, even if the distance between the movable plates 34 is long, a contact between the core member and the support plate 31 is avoided when the core member is bent.

The nozzle 12 of the syringe 11 is connected to the positive electrode of the high-voltage power source 13, and the support plate 21 (or the support plate 31) is connected to the negative electrode of the high-voltage power source 13. The support plate 21 (or the support plate 31) is grounded.

A method of manufacturing a metal nano coil by using the substrate 20 in FIG. 2 will now be explained.

The high-voltage power source 13 applies a predetermined voltage (not less than 5 kV and not more than 80 kV) between the nozzle 12 and the support plate 21. A polymer solution is pushed out of the tip of the nozzle 12 toward the substrate 20 at a constant rate. Electric attraction between the nozzle and the ground causes the polymer solution to be sprayed onto the movable plates 24 and the PTFE plate 22 of the substrate 20. When it is sprayed, a solvent in the polymer solution gradually volatilizes and becomes nanofiber when reaching the substrate 20. The nanofiber is formed across the PTFE plate 22 and between the two movable plates 24.

Nanofiber made by this electrospinning method has a cross-sectional diameter of not less than 30 nm and not more than 1000 nm.

The substrate 20 with the nanofiber placed thereon is accommodated in a vacuum desiccator to dry the nanofiber under a reduced pressure. The drying temperature, which is preferably room temperature, may be at or above 30° C. and at or below the melting point or thermal decomposition temperature of the polymer of the nanofiber. The pressure is not less than 10 Pa and not more than 100 Pa.

Drying the nanofiber causes tension to be applied to the nanofiber between the movable plates 24.

<Metal Thin Film Formation>

The PTFE plate 22 of the substrate 20 is detached. Subsequently, with the nanofiber serving as a core member, a metal thin film is formed on the surface of the core member, forming metal-covered nanofiber. Any type of metal may be used here. Preferred examples include Pt, Au and other precious metals, Cu, and Ni. The metal thin film is formed by sputtering, vapor deposition, CVD, or the like. The metal thin film has a thickness of not less than 5 not more than 50 nm.

In this method of forming a metal thin film, the side opposite to the side to which metal atoms fly is a dead side during film formation. Consequently, the thickness of the metal thin film is uneven in the circumferential direction and the dead portion has the smallest thickness.

<Reducing Tension of Metal-Covered Nanofiber>

The two movable plates 24 are moved inward. This reduces the tension of the metal-covered nanofiber, so that the metal-covered nanofiber is bent. The distance between the movable plates 24 in this case is set by considering, for example, the shrinkage rate of a metal coat during heating described later.

In the case of the substrate 30 in FIG. 3, when the movable plates 34 are moved to reduce the distance between the movable plates 34, the flexible member 35 is bent in the longitudinal direction of the movable plates 34 (in FIG. 3, toward the vertical part of the L-shaped support plate 31). Thus, the tension of the metal-covered nanofiber is reduced in two directions.

If the distance between the movable plates 34 is long (the area of the region where nanofiber is to be fabricated is large), the metal-covered nanofiber may be cut due to air fluctuation. Providing the flexible member 35 can prevent the metal-covered nanofiber from being cut.

In this process, the travel distance of the movable plates (24,34) is set such that a contact between the metal-covered nanofiber and the support plate (21,31) is prevented when the metal-covered nanofiber is bent.

<Heating of Metal-Covered Nanofiber>

With the tension of the metal-covered nanofiber reduced, the metal-covered nanofiber is thermally annealed. The temperature of thermal annealing is at or above the boiling point or thermal decomposition temperature of the polymer of the core member and at or below the melting point of the metal coat.

The thermal annealing is performed in an appropriate thermal annealing atmosphere selected depending on the type of metal coat. In the case of Pt, Au, and other metals that are resistant to oxidizing, thermal annealing is performed in an atmosphere containing oxygen, such as air, or in an atmosphere of an inert gas, such as $N_2$ or Ar. Meanwhile, in the case of metals that are oxidized (in the above example, Cu and Ni), heating is performed in an atmosphere of an inert gas.

When the metal-covered nanofiber is heated to the above temperature, the polymer of the core member is vaporized. As described above, the thickness of the metal thin film is uneven in a circumferential direction. Vaporization of the polymer increases the pressure from the inside of the metal thin film. The metal thin film is broken in the portion having the smallest thickness. The vaporized polymer is ejected to the outside of the fiber through the broken portion.

Meanwhile, the metal coat fixed to the substrate 20 is left. Since the metal coat is extremely thin, heating shrinks the metal coat into a coil shape, thereby forming a metal nano coil. The fabricated metal nano coil has a hollow or U-shaped cross section the area of which is smaller than that of a solid one. Microwave induction heating using the metal nano coil according to this embodiment, which has a small cross-sectional area, probably can improve heating efficiency.

The cross-sectional size of the metal nano coil is adjusted according to the diameter of the core member, the mismatch strain of the metal thin film, and the thickness of the metal thin film. The mismatch strain of the metal thin film can be adjusted according to the film formation method or the type of metal. The coil pitch is adjusted according to how much the tension of the metal-covered nanofiber before thermal annealing is reduced (the distance between the movable plates).

To be specific, the method according to this embodiment enables manufacture of a metal nano coil having a maximum cross-sectional diameter of 40 nm to 1000 nm, a helical diameter of 100 nm to 2000 nm, and a pitch of 100 nm to 10000 nm.

In the method according to this embodiment, a right-handed coil and a left-handed coil have almost the same number of turns. Microwave induction heating enables uniform heating even when the polarization direction for microwaves changes.

The fabricated metal nano coil is cut into a predetermined length according to the intended use.

EXAMPLE

Example 1

A metal nano coil of Pt was fabricated using PVA for the core member.

First, a PVA core member was fabricated by the electrospinning method. A 9 wt % PVA aqueous solution was prepared. PVA powder (saponification degree: 86 to 90 mol %, average degree of polymerization: 1500) was added to pure water, and the solution was agitated at a temperature of 50° C. for five hours.

The substrate 20 shown in FIG. 2 (distance between the movable plates 24: 10 mm) was placed under the syringe 11.

The syringe 11 of the manufacturing apparatus 10 shown in FIG. 1 is filled with the PVA aqueous solution. The distance from the tip of the nozzle 12 to the substrate 20 (the shortest distance from the tip of the nozzle 12 to the PTFE plate 22) was set to 25 cm. A voltage of 20 kV was applied between the nozzle 12 and the substrate 20. The PVA solution was pushed out of the tip of the nozzle 12 toward the substrate 20 at a constant rate. Consequently, PVA nanofiber (diameter: 200 to 1000 nm, average diameter: 300 nm) was formed on the movable plates 24 and the PTFE plate 22 of the substrate 20. The area where the nanofiber was formed was within the range of the longitudinal length (10 mm) of the movable plates 24.

The substrate 20 with the nanofiber placed thereon was contained in the vacuum desiccator and dried for 12 hours at room temperature under a reduced pressure (about 100 Pa). This step provided a core member fixed to the substrate 20.

The substrate 20 from which the PTFE plate 22 was detached was contained in a sputtering apparatus. Sputtering was performed under the following conditions: target: Pt, pressure: 1.5 Pa, voltage: 0.6 kV, and substrate-electrode distance: 2.5 cm. This sputtering formed a 30-nm-thick Pt thin film on the surface of the core member, thereby providing Pt-covered nanofiber.

After the formation of the Pt thin film, the distance between the movable plates 24 was changed from 10 mm to 7 mm to bend the Pt-covered nanofiber in the vertical direction. At this time, it was confirmed that the Pt-covered nanofiber and the support plate 21 were not in contact with each other.

Subsequently, the substrate 20 was contained in a quartz tube (inner diameter: 25 mm) of a heating furnace, and was thermally annealed for 30 minutes at 300° C. in an Ar atmosphere (flow rate: 10 sccm, pressure: about 170 Pa).

After thermal annealing, the substrate 20 was taken out of the quartz tube to obtain a Pt nano coil.

Figure 4:
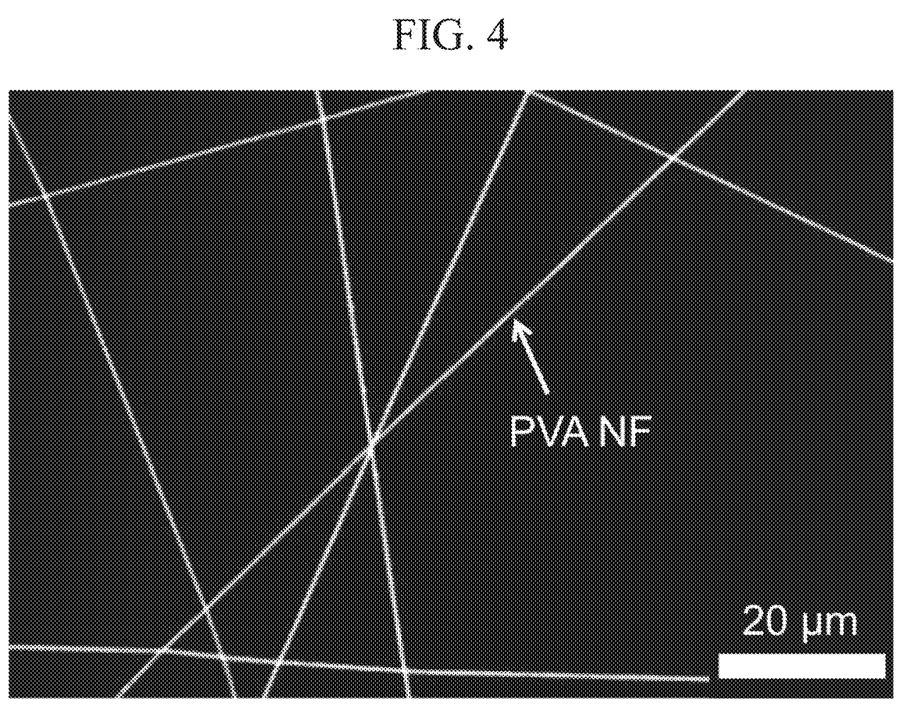
FIG. 4 is a SEM image of a polyvinyl alcohol core member fabricated in Example 1.

FIG. 4 is a SEM image of the PVA nanofiber fabricated by the electrospinning method of Example 1. The obtained nanofiber had no shrinkage found in the longitudinal direction (e.g., shrinkage into a coil form).

Figure 5:
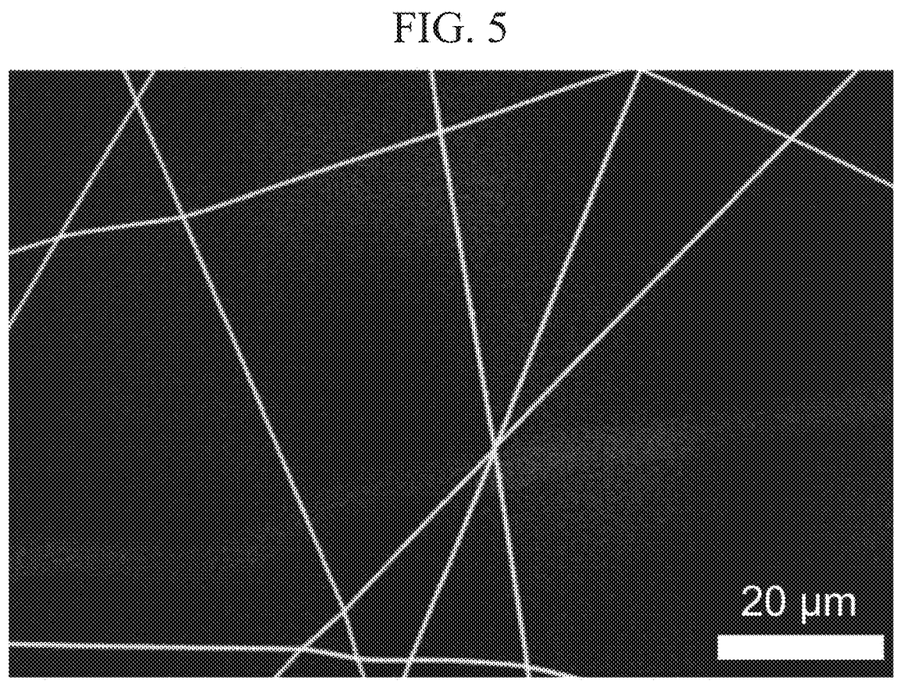
FIG. 5 is a SEM image of a Pt-covered nanostructure fabricated in Example 1.

FIG. 5 is a SEM image of the metal-covered nanofiber on which a Pt thin film is formed by the method of Example 1. Even if the Pt thin film was formed on the surface of the nanofiber, no shrinkage was observed in the nanofiber.

Figure 6:
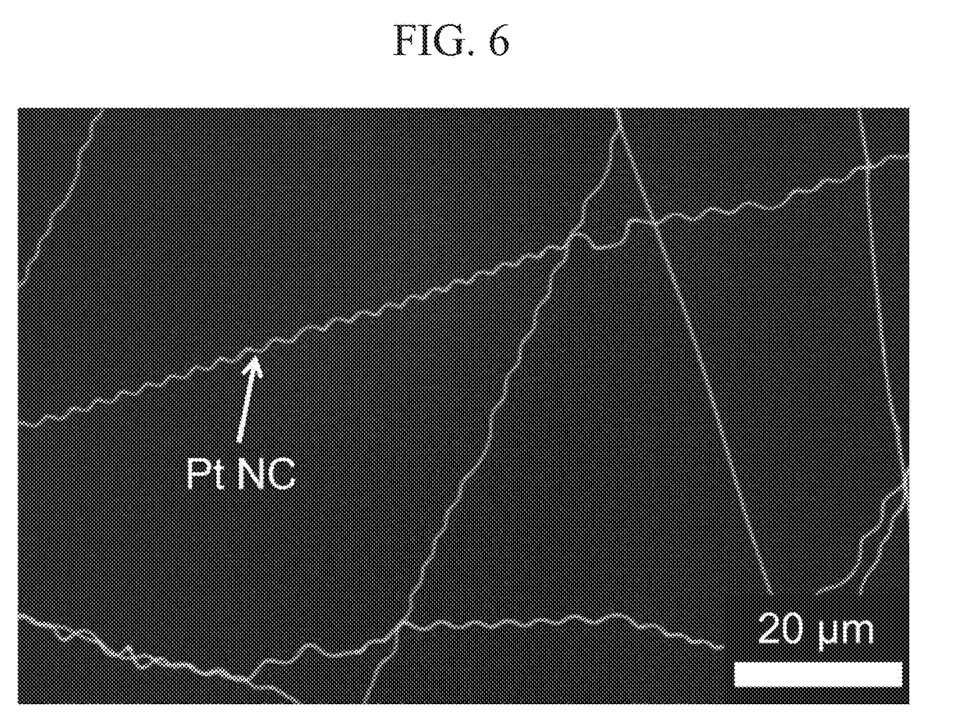
FIG. 6 is a SEM image of a Pt nano coil fabricated in Example 1.
Figure 7:
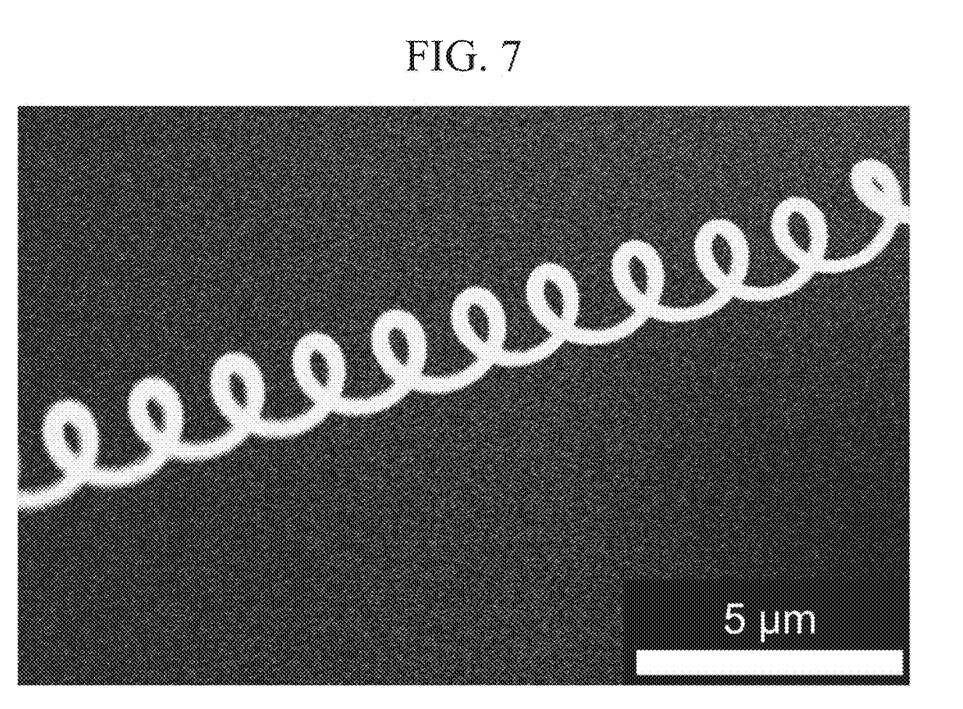
FIG. 7 is a SEM image of the Pt nano coil fabricated in Example 1.

FIGS. 6 and 7 are SEM images of the metal-covered nanofiber in FIG. 5 after thermal annealing. As shown in the drawings, thermal annealing caused the Pt thin film to shrink into a coil form. The obtained nano coil had a maximum cross-sectional diameter of about 200 to 1000 nm, a helical diameter of 0.2 to 2 µm, and a pitch of 1 to 10 µm.

Example 2

A nanofiber was fabricated using the substrate shown in FIG. 3 by the electrospinning method. The distance between the movable plates 34 of the substrate 30 was set to 36 mm. The substrate 30 was placed under the syringe 11 of the manufacturing apparatus shown in FIG. 1. The syringe 11 was filled with the same polymer solution as in Example 1. The distance from the tip of the nozzle 12 to the substrate 30 (the shortest distance from the tip of the nozzle 12 to the PTFE plate 32) was set to 36 cm.

The polymer solution was pushed out toward the substrate 30 in the same conditions as in Example 1, and PVA nanofiber (diameter: 200 to 1000 nm, average diameter: 300 nm) was formed on the movable plates 34 and the PTFE plate 32. After the formation of the nanofiber, a drying procedure was performed in the same conditions as in Example 1 to form a core member. The area where the nanofiber was formed was within the range of the longitudinal length (25 mm) of the movable plates 34.

The PTFE plate 32 was then detached from the substrate 30, and the substrate 30 was contained in a sputtering apparatus. Sputtering was performed under the following conditions: target: Pt, pressure: 1.5 Pa, voltage: 0.6 kV, and substrate-electrode distance: 2.5 cm. This sputtering formed a 30-nm-thick Pt thin film on the surface of the core member.

After the formation of the Pt thin film, the movable plates 34 were moved along the L-shaped support plate 31 and the flexible member 35 to change the distance between the movable plates 34 from 36 mm to 25 mm.

Afterwards, the substrate 30 was contained in a quartz tube (inner diameter: 25 mm) of a heating furnace and thermally annealed for 15 minutes at 300° C. in the air.

After thermal annealing, the substrate 30 was taken out of the quartz tube to obtain a Pt nano coil.

Figure 8:
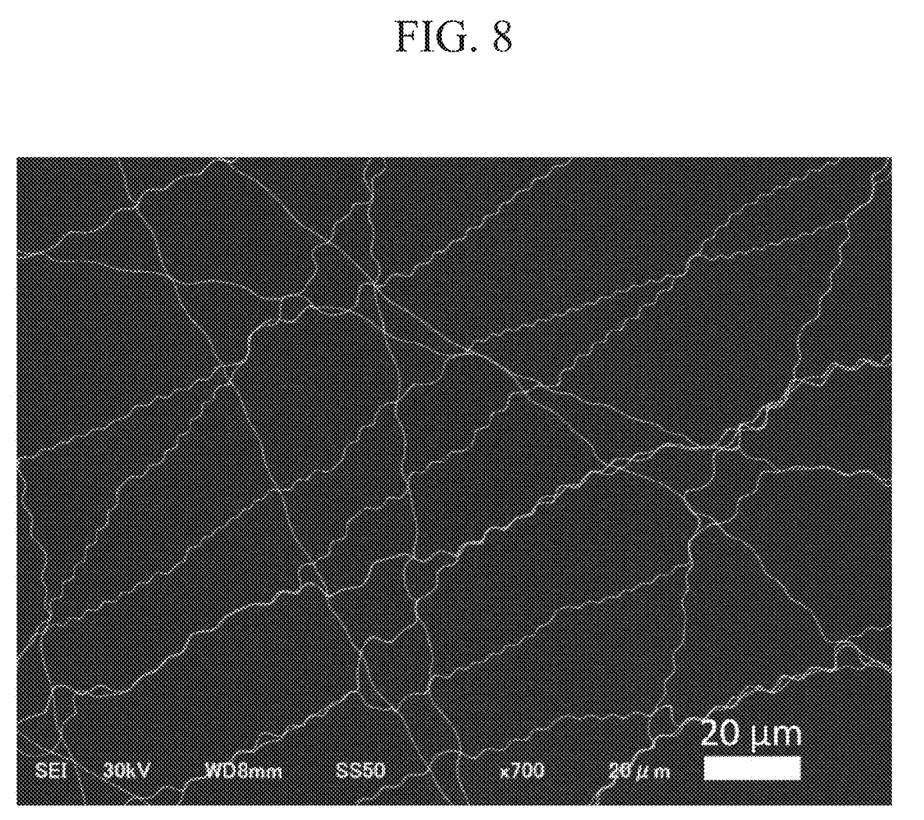
FIG. 8 is a SEM image of a Pt nano coil fabricated in Example 2.
Figure 9:
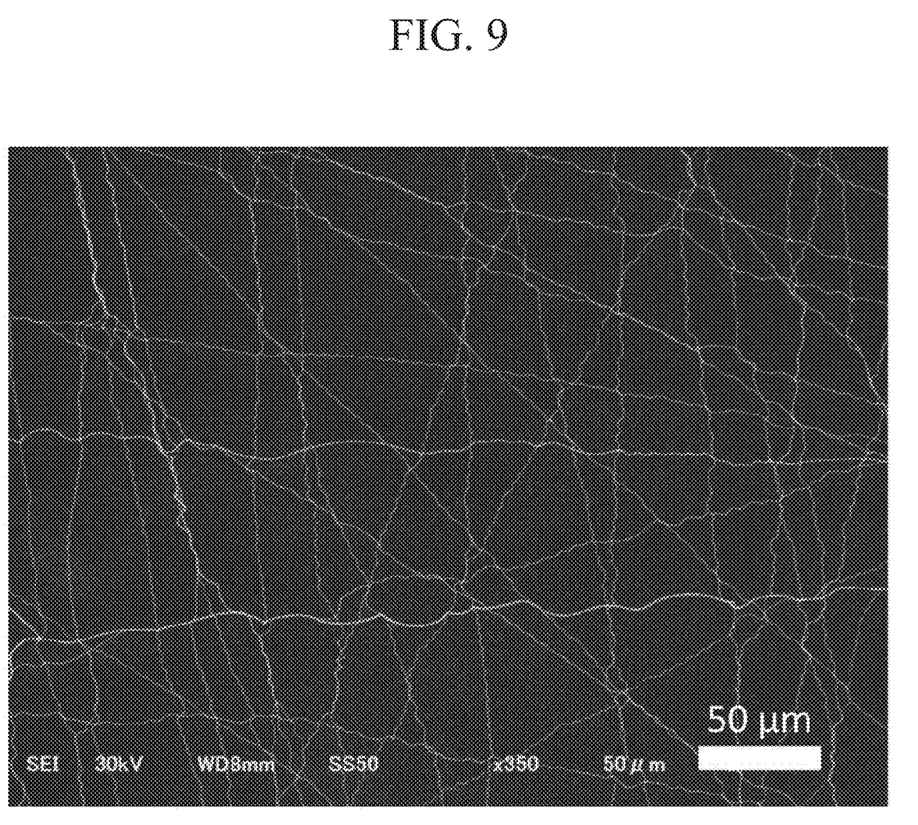
FIG. 9 is a SEM image of the Pt nano coil fabricated in Example 2.

FIGS. 8 and 9 are SEM images of the Pt nano coil fabricated in Example 2. As shown in the drawings of FIGS. 8 and 9, the process of Example 2 also provided a Pt nano coil. The obtained nano coil had a maximum cross-sectional diameter of about 200 to 1000 nm, a helical diameter of 0.2 to 2 µm, and a pitch of 1 to 10 µm.

Example 3

A core member was formed using the substrate 30 which is the same as that in Example 2, in the same conditions as in Example 2. The PTFE plate 32 was detached from the substrate 30, and the substrate 30 was then contained in a sputtering apparatus. Sputtering was performed under the following conditions: target: Cu, pressure: 1.5 Pa, voltage: 0.6 kV, and substrate-electrode distance: 2.5 cm. This sputtering formed a 30-nm-thick Cu thin film on the surface of the core member (PVA fiber).

After the formation of the Cu thin film, the movable plates 34 were moved along the L-shaped support plate 31 and the flexible member 35 to change the distance between the movable plates 34 from 36 mm to 25 mm.

Afterwards, the metal-covered nanofiber was thermally annealed in the same conditions as in Example 1. After thermal annealing, the substrate 30 was taken out of the quartz tube to obtain a Cu nano coil.

Example 4

A core member was formed using the substrate 30 which is the same as that in Example 2, in the same conditions as in Example 2. The PTFE plate 32 was detached from the substrate 30, and the substrate 30 was then contained in a sputtering apparatus. Sputtering was performed under the following conditions: target: Ni, pressure: 1.5 Pa, voltage: 0.6 kV, and substrate-electrode distance: 2.5 cm. This sputtering formed a 30-nm-thick Ni thin film on the surface of the core member (PVA fiber).

After the formation of the Ni thin film, the movable plates 34 were moved along the L-shaped support plate 31 and the flexible member 35 to change the distance between the movable plates 34 from 36 mm to 25 mm.

Afterwards, the metal-covered nanofiber was thermally annealed in the same conditions as in Example 1. After thermal annealing, the substrate 30 was taken out of the quartz tube to obtain a Ni nano coil.

Figure 10:
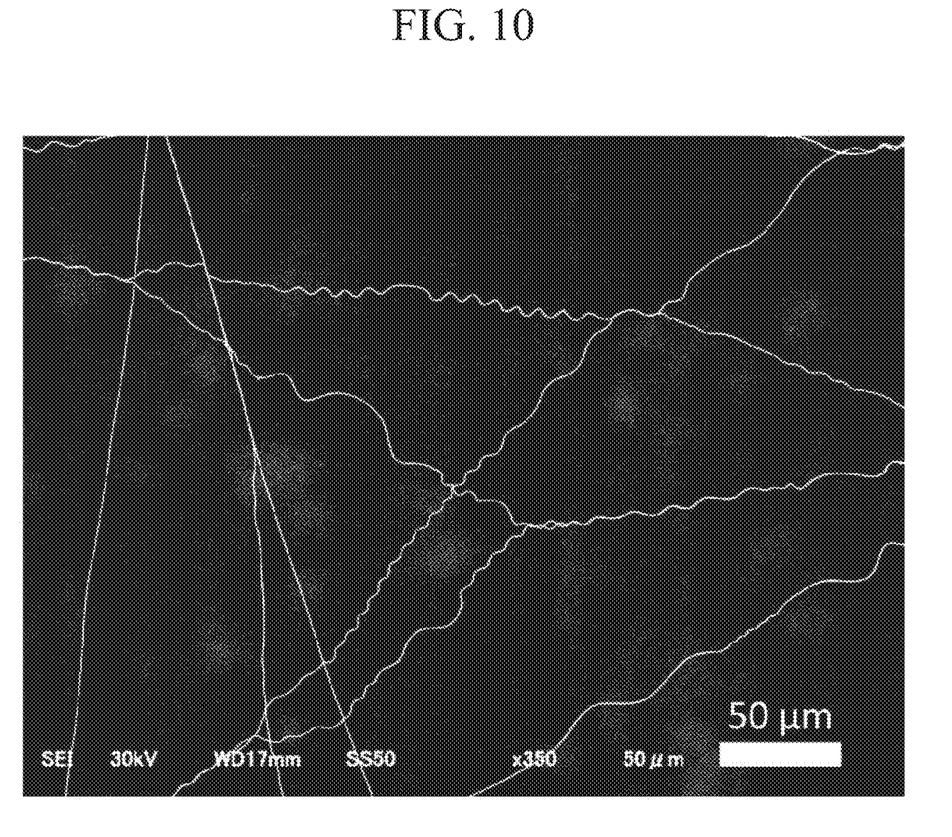
FIG. 10 is a SEM image of a Cu nano coil fabricated in Example 3.
Figure 11:
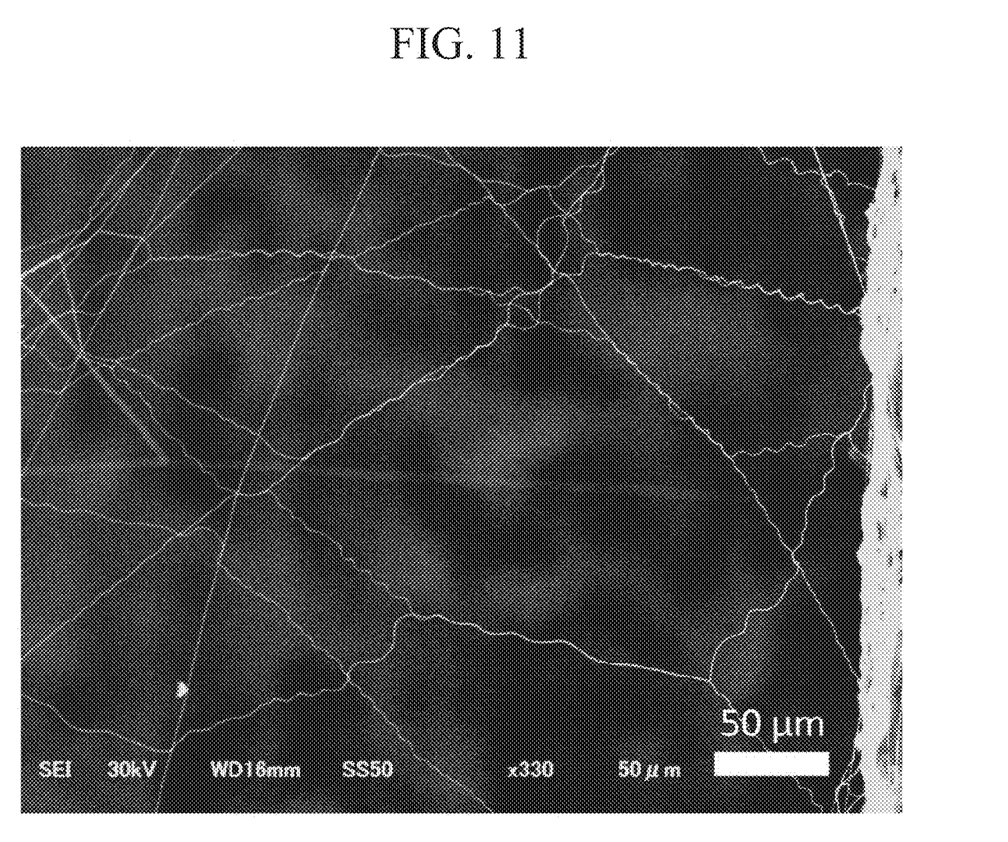
FIG. 11 is a SEM image of a Ni nano coil fabricated in Example 4.

FIG. 10 is a SEM image of the Cu nano coil fabricated in Example 3. FIG. 11 is a SEM image of the Ni nano coil fabricated in Example 4. Thus, even with the use of Cu or Ni for metal thin film layers, metal nano coils were successfully formed. The obtained nano coil had a maximum cross-sectional diameter of about 200 to 1000 nm, a helical diameter of 0.2 to 2 µm, and a pitch of 1 to 10 µm.

The invention claimed is:

1. A method of manufacturing a metal nano coil, comprising the steps of:
   forming, with tension applied to a core member composed of nanofiber of a polymer, a metal thin film on a surface of the core member to fabricate a metal-covered nanofiber;
   reducing, with both ends of the metal-covered nanofiber fixed, the tension of the metal-covered nanofiber; and
   heating, with the tension reduced, the metal-covered nanofiber to at or above a boiling point or a thermal decomposition temperature of the polymer and at or below the melting point of the metal thin film to vaporize the core member and shrink the metal thin film into a coil form, so that the metal nano coil is produced.

2. The method of manufacturing a metal nano coil according to claim 1, further comprising the steps of:
   placing two metal movable plates separately; and
   forming the core member between the movable plates by using an electrospinning method.

3. The method of manufacturing a metal nano coil according to claim 2, wherein
   the tension of the metal-covered nanofiber is reduced by reducing the distance between the movable plates, and the metal-covered nanofiber is heated with the metal-covered nanofiber fixed to the movable plates.

* * * * *